United States Patent
Kim et al.

(10) Patent No.: US 9,136,427 B2
(45) Date of Patent: Sep. 15, 2015

(54) LIGHT EMITTING DIODE AND METHOD OF FABRICATING THE SAME

(71) Applicant: Seoul Opto Device Co., Ltd., Ansan-si (KR)

(72) Inventors: Kwang Joong Kim, Ansan-si (KR); Chang Suk Han, Ansan-si (KR); Kyung Hee Ye, Ansan-si (KR); Seung Kyu Choi, Ansan-si (KR); Ki Bum Nam, Ansan-si (KR); Nam Yoon Kim, Ansan-si (KR); Kyung Hae Kim, Ansan-si (KR); Ju Hyung Yoon, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 34 days.

(21) Appl. No.: 13/713,400

(22) Filed: Dec. 13, 2012

(65) Prior Publication Data
US 2013/0099201 A1    Apr. 25, 2013

Related U.S. Application Data

(63) Continuation of application No. 12/983,499, filed on Jan. 3, 2011, now Pat. No. 8,357,924.

(30) Foreign Application Priority Data

| Jan. 5, 2010 | (KR) | 10-2010-0000559 |
| Jun. 4, 2010 | (KR) | 10-2010-0052860 |
| Jun. 4, 2010 | (KR) | 10-2010-0052861 |
| Nov. 16, 2010 | (KR) | 10-2010-0113666 |

(51) Int. Cl.
*H01L 27/15* (2006.01)
*H01L 33/06* (2010.01)
(Continued)

(52) U.S. Cl.
CPC .............. *H01L 33/06* (2013.01); *H01L 33/007* (2013.01); *H01L 33/025* (2013.01); *H01L 33/04* (2013.01);
(Continued)

(58) Field of Classification Search
CPC .. H01L 33/007; H01L 33/06; H01L 29/78687
USPC ................. 257/79, 21, 80, 83, 461, 631
See application file for complete search history.

(56) References Cited

U.S. PATENT DOCUMENTS

| 6,015,979 A | * | 1/2000 | Sugiura et al. .......... 257/86 |
| 6,252,894 B1 | | 6/2001 | Sasanuma et al. |

(Continued)

FOREIGN PATENT DOCUMENTS

| JP | H09-232629 | 9/1997 |
| JP | 2003-204078 | 7/2003 |

(Continued)

OTHER PUBLICATIONS

Non-Final Office Action dated Aug. 30, 2012 issued for U.S. Appl. No. 12/983,499.

(Continued)

*Primary Examiner* — Bradley K Smith
*Assistant Examiner* — David Goodwin
(74) *Attorney, Agent, or Firm* — H.C. Park & Associates, PLC

(57) ABSTRACT

Exemplary embodiments of the present invention disclose a light emitting diode including an n-type contact layer doped with silicon, a p-type contact layer, an active region disposed between the n-type contact layer and the p-type contact layer, a superlattice layer disposed between the n-type contact layer and the active region, the superlattice layer including a plurality of layers, an undoped intermediate layer disposed between the superlattice layer and the n-type contact layer, and an electron reinforcing layer disposed between the undoped intermediate layer and the superlattice layer. Only a final layer of the superlattice layer closest to the active region is doped with silicon, and the silicon doping concentration of the final layer is higher than that of the n-type contact layer.

9 Claims, 6 Drawing Sheets

(51) Int. Cl.
- *H01L 33/00* (2010.01)
- *H01L 33/02* (2010.01)
- *H01L 33/04* (2010.01)
- *H01L 33/32* (2010.01)
- *H01L 21/02* (2006.01)

(52) U.S. Cl.
CPC ............ *H01L 33/32* (2013.01); *H01L 21/0237* (2013.01); *H01L 21/0254* (2013.01); *H01L 21/0262* (2013.01); *H01L 21/02458* (2013.01); *H01L 21/02502* (2013.01); *H01L 21/02576* (2013.01)

(56) References Cited

U.S. PATENT DOCUMENTS

| | | | |
|---|---|---|---|
| 6,337,493 B1 * | 1/2002 | Tanizawa et al. | 257/79 |
| 6,943,377 B2 | 9/2005 | Gaska et al. | |
| 7,365,369 B2 | 4/2008 | Nakamura et al. | |
| 2005/0205881 A1 | 9/2005 | Yamazoe et al. | |
| 2008/0149918 A1 | 6/2008 | Yoo et al. | |
| 2008/0251781 A1 | 10/2008 | Han et al. | |
| 2009/0008648 A1 | 1/2009 | Biwa et al. | |
| 2010/0133508 A1 | 6/2010 | Bergmann et al. | |
| 2011/0108887 A1 | 5/2011 | Fareed et al. | |
| 2012/0037881 A1 | 2/2012 | Kim et al. | |

FOREIGN PATENT DOCUMENTS

| | | |
|---|---|---|
| JP | 2003-289156 | 10/2003 |
| JP | 2006-339657 | 12/2006 |
| JP | 2007-115887 | 5/2007 |
| JP | 2008-511154 | 2/2008 |
| JP | 2008-297191 | 12/2008 |
| WO | 2006/022498 | 3/2006 |
| WO | 2011/080249 | 7/2011 |

OTHER PUBLICATIONS

Notice of Allowance dated Oct. 3, 2012 issued for U.S. Appl. No. 12/983,499.

The extended European search report issued on Jun. 4, 2014 in European Patent Application No. 11 73 1878.

* cited by examiner

LIGHT EMITTING DIODE AND METHOD OF FABRICATING THE SAME

CROSS-REFERENCE TO RELATED APPLICATIONS

This application is a continuation of U.S. patent application Ser. No. 12/983,499, filed on Jan. 3, 2011, and claims priority from and the benefit of: Korean Patent Application No. 10-2010-0000559, filed on Jan. 5, 2010; Korean Patent Application No. 10-2010-0052860, filed on Jun. 4, 2010; Korean Patent Application No. 10-2010-0052861, filed on Jun. 4, 2010; and Korean Patent Application No. 10-2010-0113666, filed on Nov. 16, 2010, all of which are hereby incorporated by reference for all purposes as if fully set forth herein.

BACKGROUND OF THE INVENTION

1. Field of the Invention

The present invention relates to a light emitting diode and a method of fabricating the same, and more particularly, to a light emitting diode with improved electrostatic discharge is characteristics and/or luminous efficiency and a method of fabricating the same.

2. Discussion of the Background

Generally, a gallium nitride (GaN)-based semiconductor may be used for an ultraviolet or blue/green light emitting diode or laser diode, or the like, as a light source for a full-color display, a traffic signal lamp, a general lighting, and optical communication devices. The GaN-based light emitting device may include an active layer having an indium gallium nitride (InGaN)-based multi-quantum well structure disposed between n-type and p-type GaN semiconductor layers, and may generate and emit light by recombination of electrons and holes in the quantum well layer in the active layer.

FIG. 1 is a cross-sectional view of a light emitting diode according to related art.

Referring to FIG. 1, the light emitting diode includes a substrate 11, a low-temperature buffer layer or nucleation layer 13, an undoped GaN layer 15, an n-type contact layer 17, an active region 25, and a p type contact layer 27.

The light emitting diode according to the related art includes the active region 25 having the multi-quantum well structure disposed between the n-type contact layer 17 and the p-type contact layer 27, which may improve luminous efficiency. Further, the light emitting diode controls indium content of an InGaN well layer within the multi-quantum well structure, which may allow light emission of a desired wavelength.

The n-type contact layer 17 generally may have a doping concentration (i.e. number density) ranging from $10^{18}$ cm$^{-3}$ to $10^{19}$ cm$^{-3}$ and may serve to supply electrons in the light emitting diode. The current spreading performance within the light emitting diode may have a large effect on the luminous efficiency of the light emitting diode. When the n-type contact layer 17 and the p-type contact layer 27 are respectively provided with an n-electrode and a p-electrode (not shown), current concentration may occur according to a size of an area and a position in which the n-electrode and p-electrode contact the contact layers 17 and 27. When high voltage such as electrostatic discharge (ESD) is applied to the light emitting diode, ESD breakdown of the light emitting diode may easily occur due to the current concentration. In addition, thread dislocations may be generated from the low-temperature buffer layer 13 and may be transferred to the undoped GaN layer 15, the n-type contact layer 17, the active region 25, and the p-type contact layer 27. Since current may flow intensively through these thread dislocations, the ESD characteristics may lead to further deterioration of the light emitting diode.

In addition, since there may be about 11% of lattice mismatch between GaN and InN, an interfacial strain may occur between a quantum well layer and a barrier layer in the InGaN-based multi-quantum well structure. This strain may cause a piezoelectric field in the quantum well layer, thereby leading to degradation of internal quantum efficiency. In particular, in the case of a green light emitting diode, since the amount of In contained in the quantum well may be greater compared to other wavelengths, the internal quantum efficiency may be further reduced by the piezoelectric field.

In the InGaN light emitting diode, the active region having the multi-quantum well structure may generally be formed by alternately stacking the InGaN well layer and the InGaN barrier layer. The well layer is formed of a semiconductor layer having a smaller bandgap than that of the barrier layer and electrons and holes are recombined in the well layer. In addition, the barrier layers may be doped with silicon (Si) in order to lower a forward voltage Vf. However, the Si doping may have a negative effect on the crystal quality of the active region. Further, due to the limitations of epitaxial growth technology, the multi-quantum well structure may be relatively thick according to the doping of Si. In particular, when Si is doped in is the active region including In, crystal defects may frequently occur on the surface of the active region and in the active region and a wavelength shift may be easily generated due to a space charge separation generated by a polarization field.

Meanwhile, the external quantum efficiency of the light emitting diode may increase with an increase in the injection current under low current conditions, while the external quantum efficiency may be degraded with an increase in the injection current under high current conditions. This phenomenon is referred to as an efficiency droop, which may limit the efficiency of a high-output light emitting diode.

Factors that may cause efficiency droop are thermal vibration, Auger recombination, internal field within the multi-quantum well structure, non-recombination rate due to the crystal structure, etc.

Electrons and holes may not stay long in the active layer region due to the thermal vibration according to thermal or Joule heating, thereby making it possible to cause the efficiency droop. The efficiency droop may be caused by the occurrence of the Auger recombination due to the increase in carrier concentration when high current is injected. Further, the efficiency droop may be caused with the increase in non-recombination rate due to electron overflow during application of high voltage, and the efficiency droop may be caused with increase of the non-radiative recombination rate due to the defects in a semiconductor crystal.

Meanwhile, an AlGaN electron blocking layer (EBL) may be formed on the active layer in order to prevent electrons from flowing out the active layer. However, an internal field may be generated by spontaneous polarization and piezo polarization in the active layer and the electron blocking layer. Due to the internal field within the active layer and the electron blocking layer, high voltage should be applied in order to pass electrons through the active layer is having the multi-quantum well structure. In particular, if the applied voltage is larger than a built-in voltage in a 350 mA high-output diode, a conduction band at an n-type side may have a higher energy level than a conduction band at a p-type side, based on the center of the active layer. The energy level of the electron blocking layer may be lowered, which may increase leakage current. In order to increase the energy level of the electron blocking layer, an aluminum (Al) composition may be added to or be increased within the electron blocking layer; however, the increase may degrade crystal quality of the light emitting diode.

SUMMARY OF THE INVENTION

Exemplary embodiments of the present invention provide a light emitting diode with improved electrostatic discharge characteristics.

Exemplary embodiments of the present invention also provide a light emitting diode with low current leakage.

Exemplary embodiments of the present invention also provide a method for manufacturing a light emitting diode with improved current spreading performance.

Exemplary embodiments of the present invention also provide a light emitting diode capable of lowering a forward voltage by reducing the generation of an internal field.

Exemplary embodiments of the present invention also provide a light emitting diode capable of reducing efficiency droop.

Additional features of the invention will be set forth in the description which follows, and in part will be apparent from the description, or may be learned by practice of the invention.

An exemplary embodiment of the present invention discloses a light emitting is diode including an n-type contact layer doped with silicon, a p-type contact layer, an active region disposed between the n-type contact layer and the p-type contact layer, a superlattice layer disposed between the n-type contact layer and the active region, the superlattice layer including a plurality of layers, an undoped intermediate layer disposed between the superlattice layer and the n-type contact layer, and an electron reinforcing layer disposed between the undoped intermediate layer and the superlattice layer, wherein only a final layer of the superlattice layer closest to the active region is doped with silicon, and the silicon doping concentration of the final layer is higher than that of the n-type contact layer.

An exemplary embodiment of the present invention also discloses a method of fabricating a light emitting diode including forming a buffer layer on a substrate, forming an n-type contact layer doped with silicon on the buffer layer, forming an undoped intermediate layer on the n-type contact layer, forming an electron reinforcing layer on the undoped intermediate layer, forming a superlattice layer on the electron reinforcing layer, the superlattice layer including a plurality of layers, and forming an active region on the superlattice layer, wherein only a final layer of the superlattice layer is doped with silicon, and the silicon doping concentration of the final layer is higher than that of the n-type contact layer.

An exemplary embodiment of the present invention also discloses a light emitting diode including an n-type contact layer doped with silicon, a p-type contact layer, an active region disposed between the n-type contact layer and the p-type contact layer, a superlattice layer disposed between the n-type contact layer and the active region, the superlattice layer including a plurality of layers, an undoped intermediate layer disposed between the superlattice layer and the n-type contact layer, and an electron reinforcing layer disposed between the undoped intermediate layer and the superlattice layer, wherein the n-type contact layer has at least two n-type GaN layers and an n-type AlGaN layers disposed between the at least two n-type GaN layers.

An exemplary embodiment of the present invention also discloses a light emitting diode, including an n-type contact layer, a p-type contact layer disposed on the n-type contact layer, an active region having a multi-quantum well structure, the active region disposed between the n-type contact layer and the p-type contact layer, and a spacer layer disposed between the n-type contact layer and the active region, wherein the spacer layer is doped with n-type impurities, and the n-type impurity doping concentration is relatively higher than the impurity doping concentration of the n-type contact layer, and the active region is undoped.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
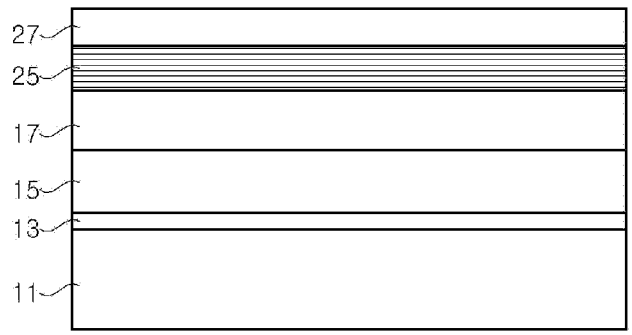
FIG. 1 is a cross-sectional view showing a light emitting diode according to the related art.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Figure 2:
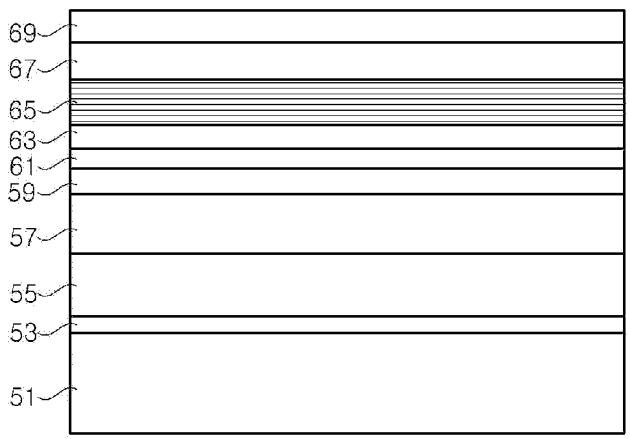
FIG. 2 is a cross-sectional view showing a light emitting diode according to an exemplary embodiment of the present invention.
Figure 3:
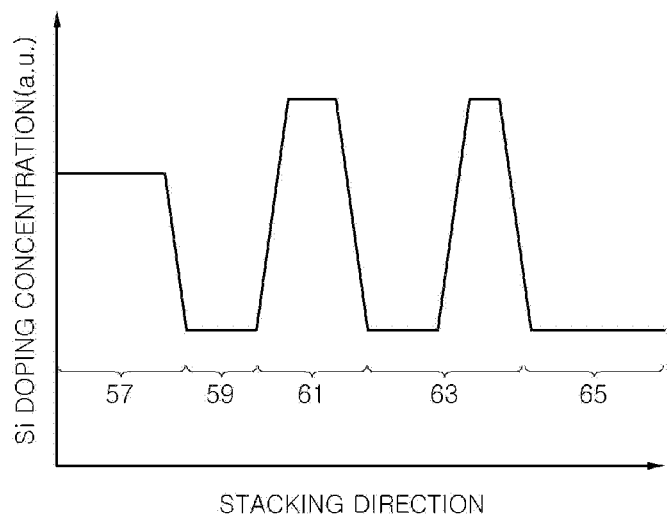
FIG. 3 is a schematic diagram showing a silicon doping profile of a light emitting is diode according to an exemplary embodiment of the present invention.

FIG. 2 is a cross-sectional view showing a light emitting diode according to an exemplary embodiment of the present invention, and FIG. 3 shows a schematic silicon doping profile of the light emitting diode.

Referring to FIG. 2 and FIG. 3, the light emitting diode is configured to include an n-type contact layer 57, an undoped intermediate layer 59, an electron reinforcing layer 61, a superlattice layer 63, an active region 65, and a p-type contact layer 69. Further, the light emitting diode may include a substrate 51, a low-temperature buffer layer or nucleation layer 53, a buffer layer 55, and a p-type clad layer 67.

The substrate 51 is a substrate for growing a GaN-based semiconductor layer. The substrate may be made of sapphire, SiC, spinel, or the like, but is not specifically limited thereto. For example, the substrate may be a patterned sapphire substrate (PSS).

The nucleation layer 53 may be formed of (Al, Ga)N at a temperature of 400 to 600° C. in order to grow the buffer layer 55 on the substrate 51. The nucleation layer 53 may be made of GaN or AlN. The nucleation layer may have a thickness of about 25 nm. The buffer layer 55, which may reduce defect occurrences such as dislocations between the substrate 51 and the n-type contact layer 57, is grown at a relatively higher temperature than the nucleation layer 53. The buffer layer 55 may be made of, for example, undoped GaN.

Figure 4:
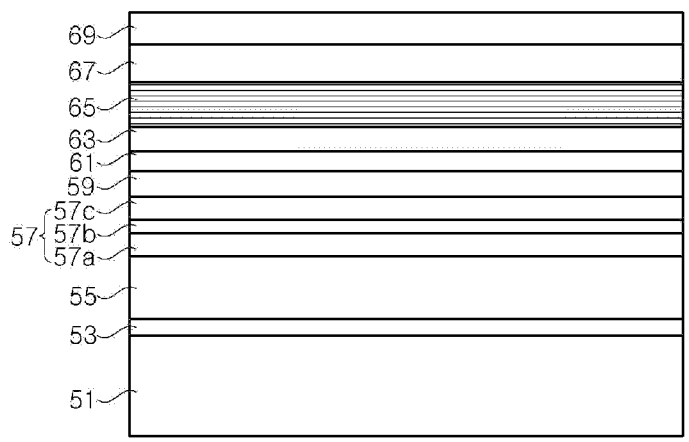
FIG. 4 is a cross-sectional view showing a light emitting diode according to an exemplary embodiment of the present invention.

The n-type contact layer 57 is formed of an n-type impurity, and may be, for example, an Si-doped GaN-based semiconductor layer. The n-type contact layer 57 may include a GaN layer and may be formed of a single layer or a multilayer. As shown in FIG. 4, the n-type contact layer 57 may be configured to include an n-type first GaN layer 57a, an n-type AlGaN layer 57b, and an n-type second GaN layer 57c. That is, the AlGaN layer 57b is interposed between the GaN layers 57a and 57c. A Si doping concentration doped on the n-type contact layer may be in the range of $10^{18}$ cm$^{-3}$ to $10^{19}$ cm$^{-3}$.

For example, as shown in FIG. 4, when the first n-type GaN layer 57a is grown and then the n-type AlGaN layer 57b is grown, biaxial stress may occur by the n-type AlGaN layer 57b. In addition, when the second n-type GaN layer 57c is grown, the biaxial stress may be reduced by compression stress, thereby making it possible to reduce thread dislocations due to the change in stress. Therefore, it is possible to prevent the thread dislocations transferred through the nucleation layer 53 and the high-temperature buffer layer 55 from being transferred to the active region 65 by disposing the n-type AlGaN layer 57b between the n-type GaN layers 57a and 57c.

The undoped intermediate layer 59 may be made of GaN, which is not intentionally doped with impurities, to have a thickness of 100 to 5000 Å. Since the undoped intermediate layer 59 is not doped with impurities, it may have relatively higher specific resistance as compared to the n-type contact layer 57. Therefore, electrons introduced into the active layer 65 from the n-type contact layer 57 may be uniformly spread within the n-type contact layer 57 before passing through the undoped intermediate layer 59.

The electron reinforcing layer 61 is formed on the undoped intermediate layer 59. The electron reinforcing layer 61 may be made of GaN doped with Si at high concentration to have a thickness of 10 to 2000 Å, thereby making it possible to lower the forward voltage Vf of the light emitting diode. As shown in FIG. 3, the doping concentration of Si doped in the electron reinforcing layer 61 is greater than the silicon doping concentration of the n-type contact layer 57. The Si doping concentration within the electron reinforcing layer 61 may be at least four times greater than the Si doping concentration of the n-type contact layer 57.

The n-type contact layer 57, the undoped intermediate layer 59, and the electron reinforcing layer 61 may be continuously grown by supplying a metal source gas and a nitrogen source gas to a growth chamber. As a raw material of the metal source gas, metal-organic gasses containing Al, Ga, and In, for example, trimethylaluminum (TMA), trimethylgallium (TMG), and/or trimethylindium (TMI), or the like, may be used. As a raw material of the nitrogen source gas, ammonia, or the like, may be used. These layers may be grown at a temperature of 1050° C. to 1150° C., for example.

The superlattice layer 63 is formed on the electron reinforcing layer 61. The superlattice layer 63 may be formed by alternately stacking the GaN layer and the InGaN layer at a thickness of, for example, 20 Å. A first layer of the superlattice layer 63 may be made of GaN or InGaN, but the final layer may be made of GaN. The first layer of the superlattice layer 63 directly contacts the electrode reinforcing layer 61, and the final layer of the superlattice layer 63 is directly contacts the active layer 65. The final layer of the superlattice layer 63 is doped with high-concentration Si. The doping concentration of Si doped on the final layer may be about four times to five times higher than the concentration of Si doped on the n-type contact layer 57. The Si concentration doped on the final layer of the superlattice layer 63 may be approximately the same as the Si doping concentration of the electron reinforcing layer 61. Therefore, the final layer of the superlattice layer 63 and the electron reinforcing layer 61 below the superlattice layer 63 are formed of a high-concentration Si doped layer and the remaining layers of the superlattice layer 63 positioned therebetween are formed of substantially undoped GaN or InGaN.

Most layers of the superlattice layer 63 may be formed of substantially undoped GaN or InGaN, thereby possibly reducing the leakage current of the light emitting diode. Further, the final layer of the superlattice layer 63 is doped at high concentration, thereby possibly improving junction characteristics between the superlattice layer 63 and the active region 65.

Figure 5:
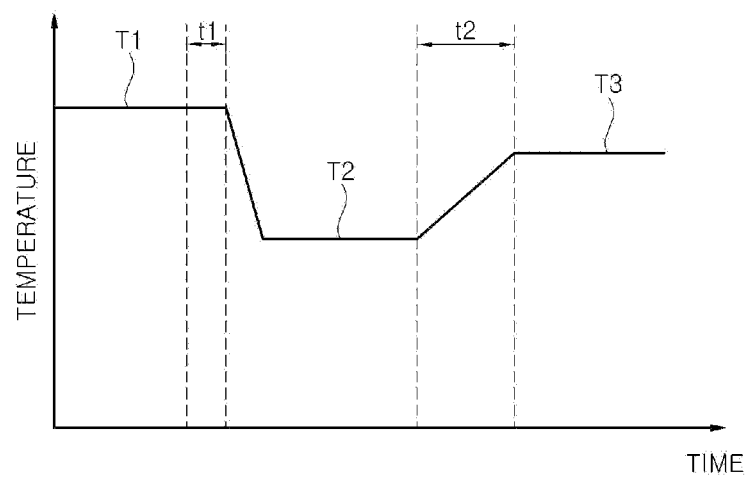
FIG. 5 is a schematic temperature profile showing a method for manufacturing a light emitting diode according to an exemplary embodiment of the present invention

The superlattice layer 63 may be grown at a relatively lower temperature as compared with the electron reinforcing layer 61. As shown in FIG. 5, before the superlattice layer 63 is grown, the electron reinforcing layer 61 is grown at a first temperature T1 and then the supply of metal source gas is stopped for a first time t1, and the grown electron reinforcing layer 61 is maintained on the substrate 21 at the first temperature T1. The first time t1 may be a time sufficient for discharging the metal source gas remaining in the chamber, that is, about 3 to 10 minutes, and may be, about 5 to 7 minutes. In addition, during the first time t1, the n-type contact layer 57 and the intermediate layer 59 may be heat-treated, including the electron reinforcing layer 61, thereby improving the crystal quality of the n-side semiconductor layer.

Then, the temperature of the substrate 21 may be decreased from the first temperature T1 to a second temperature T2. The second temperature T2 is set to a temperature suitable to grow the superlattice layer 63. The second temperature T2 may be in the range of, for example, 650° C. to 800° C.

After the growth of the superlattice layer 63 is completed, the active region 65 is grown on the superlattice layer 63. The active region 65 may be grown at the same temperature as the superlattice layer 63 or a relatively lower temperature than for the growth of the superlattice layer 63, for example, 650° C. to 750° C. For simplification, FIG. 5 shows the case in which the active region 65 is grown at the same growth temperature as the superlattice layer 63, i.e., the second temperature T2.

The active region 65 may have the multi-quantum well structure in which the barrier layer and the InGaN quantum well layer are alternately stacked. The barrier layer may be formed of a GaN-based semiconductor having a wider bandgap than that of the quantum well layer, for example, GaN, InGaN, AlGaN, or AlInGaN. The In composition ratio within the InGaN quantum well layer is determined by the desired optical wavelength. The active region 65 may directly contact the final layer of the superlattice layer 63. The barrier layer and the quantum well layer of the active region 65 may be formed of the undoped layer in which impurities are not doped, in order to improve the crystal quality of the active region or may be doped with impurities within some of or the entire active region in order to lower the forward voltage Vf.

A p-type contact layer 69 is disposed on the active region 65 and a p-type clad layer 67 may be interposed between the active region 65 and the p-type contact layer 69. For example, after the growth of the active region 65 is completed, the supply of the metal source gas is stopped and the temperature of the substrate 51 increases to a third temperature T3 for the second time t2. The second time t2 is set to a time in which the metal source gas remaining in the chamber can be sufficiently discharged. For example, the second time t2 may be in the range of 5 to 15 minutes. Alternatively, after the growth of the active region 65 is completed, the supply of metal source gas may stop, and the temperature of the substrate 51 may be maintained at the active region growth temperature for a third time (not shown), for example, at the second temperature T2 for a third time. The third time may be, for example, in the same range as the first time t1, i.e., 3 to 10 minutes. After the growth of the active region 65 is completed, the temperature may be maintained at the second temperature T2 for the third time or increased from the second temperature T2 to the third temperature T3 for the second time t2, but is not limited thereto. These methods may also be used together, in complement with each other.

Then, the metal source gas is supplied to the chamber and the p-side GaN-based semiconductor layer, for example, the p-type clad layer 67 or the p-type contact layer 69 are grown, at the third temperature T3. The p-type clad layer 67 may be AlGaN. In addition, the p-type GaN-based semiconductor layer 69 may be a multi-layer structure including a single layer or a GaN layer.

After the growth of the epitaxial layers of the light emitting diode is completed, the individual light emitting diode chips are manufactured.

EXPERIMENTAL EXAMPLE 1

The epitaxial layers having the above-mentioned structure were grown with reference to FIG. 2 and FIG. 3 by using a metal-organic chemical vapor deposition (MOCVD) device. In the present experimental example, all the other conditions were the same as described above, and the Si doping position was different at the GaN/InGaN superlattice layer 63. The n-type GaN contact layer 57, the undoped GaN intermediate layer 59, the high-concentration doped GaN electron reinforcing layer 61 were sequentially grown on the undoped GaN buffer layer 55, the superlattice layer 63 was grown on the electron reinforcing layer 61, and the active region 65 having the multi-quantum well structure, the p-type AlGaN clad layer 67, and the p-type GaN contact layer 69 were sequentially grown on the superlattice layer 63.

In a Comparative Example, Si was doped on all of the GaN layers in the superlattice layer 63, and, in the Experimental Example 1, Si was doped only in the final layer of the superlattice layer 63, i.e., the GaN layer with Si at the same high concentration as the electron reinforcing layer 61. The grown epitaxial layers were separated, together with the substrate, and the optical characteristics and the electrical characteristics were measured. The results are shown in Table 1. In this configuration, the electrostatic discharge (ESD) test was performed by applying a reverse voltage of 1000 V to functional light emitting diodes manufactured on the same wafer. Then, failures of the light emitting diodes were checked and the ESD characteristics were represented by ESD pass ratio. For the optical output and the electrical characteristic values, the values measured before the ESD test was performed were represented by percentage based on the Comparative Example.

TABLE 1

| | ESD Pass Ratio | Peak Wavelength (nm) | Forward Voltage (Vf) | Optical Output | Leakage Current @−5 V | Reverse Voltage (Vr) @ 10 µA |
|---|---|---|---|---|---|---|
| Comparative Example | 0% | 456.6 | 100 | 100 | 100 | 100 |
| Example | 92% | 451.5 | 100.6 | 97.4 | 11.61 | 118.6 |

Referring to Table 1, Experimental Example 1 according to the present exemplary embodiment showed a slightly reduced peak wavelength, a slightly increased forward voltage Vf and a slightly reduced optical output, as compared to the Comparative Example. However, the Experimental Example 1 showed an unexpectedly reduced leakage current compared to the Comparative Example. Therefore, Experimental Example 1, exhibits a significant improvement of the ESD characteristics of the light emitting diode according to the present exemplary embodiment.

EXPERIMENTAL EXAMPLE 2

The light emitting diode having a structure according to the exemplary embodiment shown in FIG. 4 was grown by a MOCVD process. In the present exemplary embodiment, all the other conditions were the same as in the exemplary embodiment shown in FIG. 2, but the Comparative Example had an n-type contact layer 57 formed only n-type GaN while the Experimental Example 2 had an n-type contact layer 57 including n-type AlGaN layer interposed between n-type GaN layers.

The grown epitaxial layers were separated, together with the substrate, and the optical characteristics and the electrical characteristics were measured. The results are shown in Table 2. In this configuration, the ESD test was performed by applying a reverse voltage of 1000 V to functional light emitting diodes manufactured on the same wafer. Then, the failures of the light emitting diodes were checked, and the ESD characteristics were represented by an ESD pass ratio. The optical output and the leakage current were measured for the functional light emitting diodes that passed the ESD test and the values measured in the functional light emitting diodes were represented by percentage, based on Comparative Example.

TABLE 2

|  | ESD Pass Ratio | Peak Wavelength (nm) | Optical Output | Leakage Current @ −5 V |
|---|---|---|---|---|
| Comparative Example | 69.34% | 454.0 | 100 | 100 |
| Example | 87.68% | 453.64 | 98.9 | 100 |

Referring to Table 2, Experimental Example 2 according to the present exemplary embodiment showed a slightly reduced peak wavelength and a slightly reduced optical output, as compared to Comparative Example. However, Experimental Example 2 showed significantly improved ESD characteristics as compared to Comparative Example, and the leakage current of the light emitting diodes that passed the ESD test showed no difference between Comparative Example and Experimental Example 2.

Figure 6:
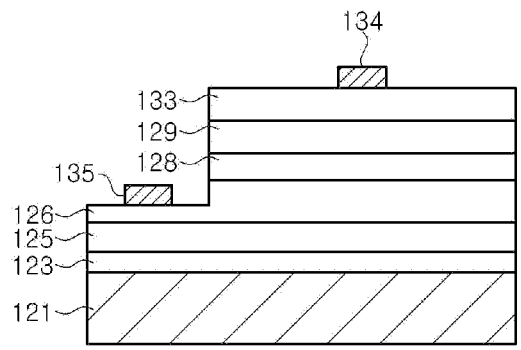
FIG. 6 is a cross-sectional view showing a light emitting diode according to an exemplary embodiment of the present invention.
Figure 7:
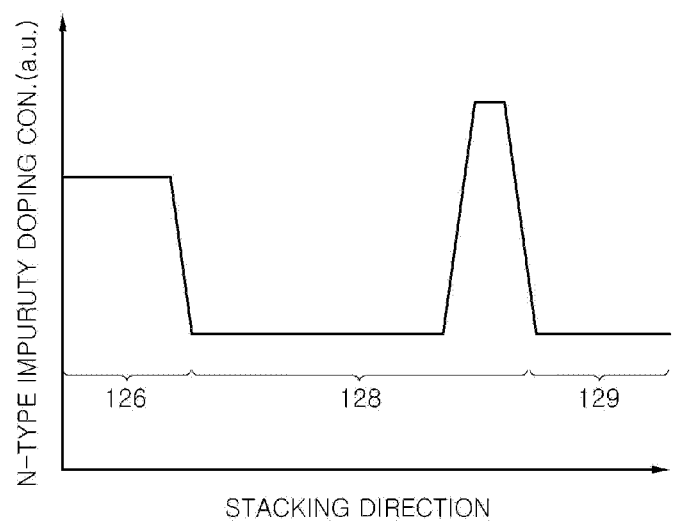
FIG. 7 is a schematic diagram showing a silicon doping profile of a light emitting diode according to an exemplary embodiment of the present invention.

FIG. 6 is a cross-sectional view of a light emitting diode according to an exemplary embodiment of the present invention. FIG. 7 shows a schematic silicon doping profile of the light emitting diode, and FIG. 8 shows a spacer layer structure of the light emitting diode.

Figure 8:
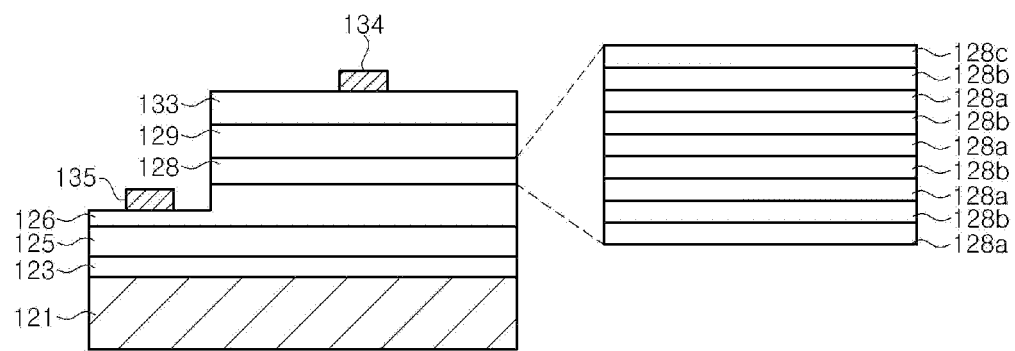
FIG. 8 is a cross-sectional view showing a spacer layer structure of a light emitting diode according to an exemplary embodiment of the present invention.

Referring to FIG. 6, FIG. 7, and FIG. 8, the light emitting diode of the present exemplary embodiment includes a substrate 121, an n-type contact layer 126, a spacer layer 128, an active region 129 having a multi-quantum well structure, and a p-type contact layer 133. In addition, a nucleation layer 123 and an undoped GaN layer 125 (u-GaN) may be interposed between the substrate 121 and the n-type contact layer 126.

On the substrate 121, a GaN-based semiconductor layer may be grown. The substrate 121 may be made of sapphire, SiC, spinel, or the like, but is not specifically limited thereto. For example, the substrate may be a patterned sapphire substrate (PSS).

The nucleation layer 123 may be made of (Al, Ga)N at a temperature of 400° C. to 600° C. in order to grow the u-GaN layer 125 on the substrate 121. The nucleation layer may be is formed to a thickness of about 25 nm.

The u-GaN layer 125 is a layer to reduce the occurrence of defects such as dislocations between the substrate 121 and the n-type contact layer 126 and is grown at relatively high temperature, for example, 900 to 1200° C.

The n-type contact layer 126 is a layer on which the n-electrode 139 is formed and may be doped with n-type impurities such as Si or Ge. For example, the impurity concentration of the n-type contact layer 126 may be, for example, $5 \times 10^{18}$ cm$^{-3}$ and may be an n-GaN layer grown at relatively high temperature, for example, to a thickness of 2 μm or less at 900° C. to 1200° C.

The spacer layer 128 may be made of a (Al, In, Ga)N-based group III-nitride semiconductor layer having a smaller bandgap than that of the barrier layer of the active region 129 and a larger bandgap than that of the well layer. For example, the spacer layer 128 may include $In_xGa_{1-x}N$ (0≤x<1).

The spacer layer 128 is doped with an n-type impurity at high concentration to lower the forward voltage Vf of the light emitting diode. As shown in FIG. 7, the doping concentration of the n-type impurity doped on the spacer layer 128 is higher than the n-type impurity doping concentration of the n-type contact layer 126.

The In composition ratio of the spacer layer 128 may be smaller than the In composition ratio within the InGaN quantum well layer. In this case, the spacer layer 128 may confine charges in the active region 128 quantum well layer, possibly improving the luminous efficiency of the light emitting diode.

In the present exemplary embodiment, the n-type impurity is doped in at least one thickness region adjacent to the active region 129 based on the growth direction of the spacer is layer 128. The remaining thickness regions other than thickness regions doped with the n-type impurity are undoped (i.e., not doped with the n-type impurity). Only some thickness region adjacent to the active region 129 among the entire thickness regions of the spacer layer 128 may be doped with the n-type impurity so that electrons may be efficiently injected from the spacer layer 128 to the active region 129. In addition, the doping concentration in the area in which the n-type impurity is doped may be relatively higher than the impurity doping concentration of the n-type contact layer 126, for example, $9 \times 10^{19}$ cm$^{-3}$. Therefore, a resistance increase of the spacer layer 128 can be prevented and the electron injection efficiency into the active region 129 can be increased due to electrons generated in the spacer layer 128. Meanwhile, as shown in FIG. 8, the spacer layer 128 may have a structure in which (Al, In, Ga)N-based group III-nitride semiconductor layers 128a and 128b having a smaller bandgap than that of the barrier layer of the active region 129 and a larger bandgap than that of the well layer are alternately stacked. For example, the spacer layer 128 may be made by alternately stacking $In_xGa_{1-x}N$ (0≤x<1) 128a and $In_yGa_{1-y}N$ (0≤y<1) 128b having different compositions. The $In_xGa_{1-x}N$ (0≤x<1) 128a may be formed at, for example, a thickness of 30 Å to 40 Å, and the $In_yGa_{1-y}N$ (0≤y<1) 128b may be formed at a thickness of 15 Å to 20 Å.

The spacer layers 128 having a stacked structure of $In_xGa_{1-x}N$ (0≤x<1) 128a and $In_yGa_{1-y}N$ (0≤y<1) 128b may improve the crystallinity of the active region 129 formed thereon and reduce strain. The spacer layers 128a and 128b may be formed at seven to fifteen periods. When the spacer layers 128 are formed in fewer than 7 periods, the spacer layers 128 may weakly alleviate the strain generated in the active region 129, and when the spacer layers 128 are formed in greater than 15 periods, a process time may increase.

At this time, at least one layer 128a or 128b adjacent to the active region 129 in is the spacer layers 128 is doped with n-type impurities. The remaining layers other than the layers doped with the n-type impurities are undoped (i.e., not doped with the n-type impurities). Only an InGaN layer 128a and/or an InGaN layer 128b adjacent to the active region 129 of the spacer layers 128 is doped with the n-type impurities, thereby making it possible to efficiently inject electrons from the spacer layers 128 into the active region 129. In addition, the doping concentration of the InGaN layer 128a doped with the n-type impurities may be, for example, $9 \times 10^{19}$ cm$^{-3}$, which is relatively higher than the impurity doping concentration of the n-type contact layer 126. Accordingly, the increase in resistance of the spacer layers 128 may be prevented, and the efficiency of injection of the electrons into the active region 129 may increase by the charge created in the spacer layers 128.

Most layers of the spacer layers 128 are formed as undoped layers, thereby making it possible to reduce leakage current of the light emitting diode. In addition, at least one layer 128a or 128b adjacent to the active region 129 is doped with the n-type impurities at a high concentration, thereby making it possible to improve junction characteristics between the spacer layer 128 and the active region 129.

Meanwhile, a spacer layer 128c adjacent to the active region 129 may be an InGaN layer further including a greater amount of In compared to other semiconductor layers configuring the spacer layer 128. At this time, the amount of In included in the spacer layer 128c adjacent to the active region 129 may be higher than that in the quantum well layer of the active region 129. In the present exemplary embodiment, the n-type impurities are doped at about the same doping concentration of the n-type contact layer 126, and may be preferably doped toward the n-type contact layer 126 within the spacer layer 128c.

The active region 129 has a multi-quantum well structure in which a barrier layer and a quantum well layer are alternately stacked, wherein the quantum well layer includes an InGaN layer. The quantum barrier layer may be made of a GaN-based semiconductor layer having a bandgap wider than that of the quantum well layer, for example, GaN, InGaN, AlGaN, or AlInGaN. An In composition ratio within the InGaN quantum well layer is determined by a desired optical wavelength. The active region 129 is undoped (i.e., not doped with the n-type impurities, for example, Si or Ge).

A p-type contact layer 133 is disposed on the active region 129. The p-type contact layer 133 may be made of, for example, GaN.

In addition, a transparent electrode (not shown) such as Ni/Au or indium tin oxide (ITO) is formed on the p-type contact layer 133, and a p-electrode 134 may be formed thereon using a liftoff process. Further, an n-electrode 135 such as Ti/Al, etc., may be formed on the n-type contact layer 126 using the liftoff process.

In the exemplary embodiments as described above, the active region 129 has the barrier layer and the quantum well layer undoped (i.e., not doped with the n-type impurities) and is grown on the spacer layer 128 having the stacked structure of $In_xGa_{1-x}N$ ($0 \leq x < 1$) 128a and $In_yGa_{1-y}N$ ($0 \leq y < 1$) 128b mostly not including the n-type impurities, thereby making it possible to improve the crystallinity of the active region 129 and reduce strain. In addition, only the InGaN layer 128a and/or the InGaN layer 128b adjacent to the active region 129 of the spacer layers 128 are doped with the n-type impurities to smoothly inject electrons from the spacer layer 128 into the active region 129, thereby making it possible to increase a recombination ratio of carriers in the active region 129. As a result, it is possible to improve light emitting efficiency of the light emitting diode.

Figure 9:
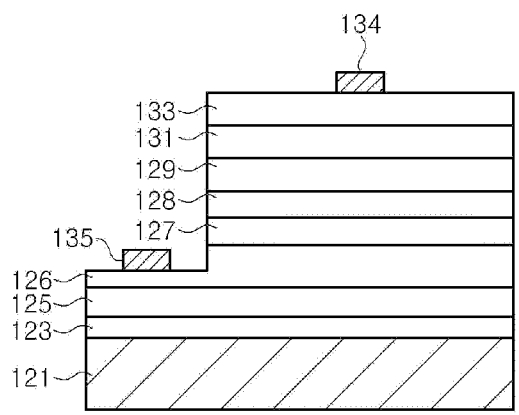
FIG. 9 is a cross-sectional view showing a light emitting diode according to an exemplary embodiment of the present invention.
Figure 10:
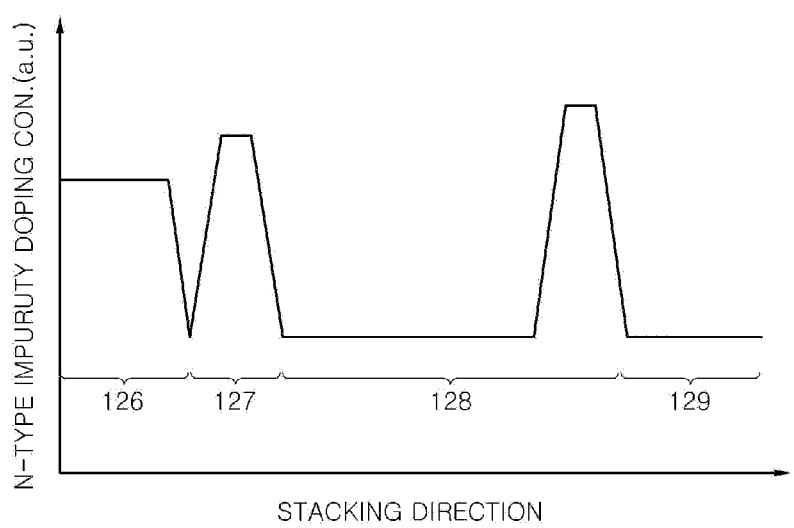
FIG. 10 is a schematic diagram showing a silicon doping profile of a light emitting diode according to an exemplary embodiment of the present invention.

FIG. 9 and FIG. 10 each are cross-sectional views for explaining a light emitting is diode according to another exemplary embodiment of the present invention and show a silicon doping profile.

Referring to FIG. 9 and FIG. 10, a light emitting diode according to the present exemplary embodiment has the almost same stacked structure as that of the light emitting diode described with reference to FIG. 6, FIG. 7, and FIG. 8; however, it further includes an intermediate layer 127 doped with n-type impurities between the spacer layer 128 and the n-type contact layer 126 and a p-type clad layer 131 interposed between the active region 129 and the p-type contact layer 133.

The intermediate layer 127 is doped with the n-type impurities at, for example, a concentration of $2.5 \times 10^{19}$ cm$^{-3}$, which is relatively higher than the impurity doping concentration of the n-type contact layer 126 and is relative lower than the n-type impurity doping concentration of the spacer layer 128, and may include an n-AlGaN layer, as shown in FIG. 10.

The n-AlGaN layer may have gradually or stepwise reduced Al composition toward the active region 129. At this time, Al has a composition range of 10% to 15% and is stacked at a thickness of 10 nm to 100 nm, and may have a thickness of 30 nm to 60 nm. The Al composition is gradually or stepwise reduced within the n-AlGaN layer, such that the intermediate layer 127 has a gradually reduced energy level toward the active region 129. Therefore, the intermediate layer 127 may have the lowest energy level at the interface between to the intermediate layer 127 and the spacer layer 128.

In addition, the n-AlGaN layer may be formed in a multi-layer film structure. For example, n-AlGaN layer may be configured of a multi-layer film of AlGaN/GaN or AlGaN/InGaN. When the n-AlGaN layer is configured of the multi-layer film, it is to improve the crystallinity of the AlGaN layer. For example, the n-AlGaN layer may have gradually or stepwise reduced Al composition toward the active region 129.

Figure 11:
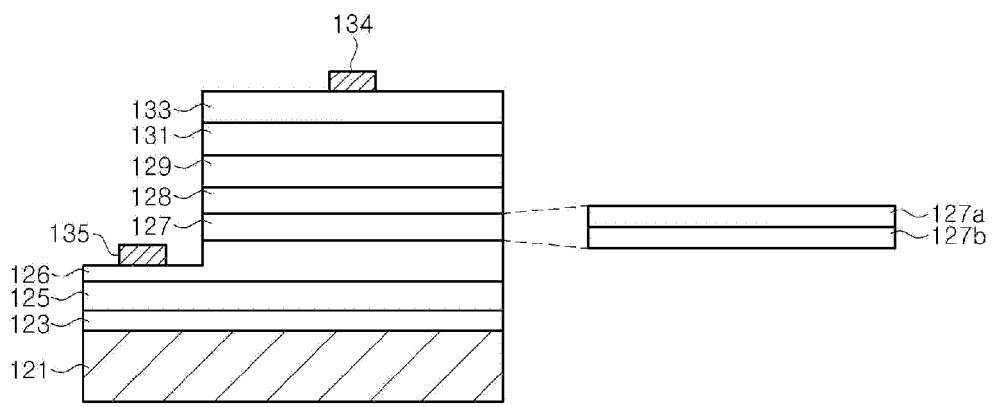
FIG. 11 is a cross-sectional view showing a light emitting diode according to an exemplary embodiment of the present invention.

Meanwhile, the intermediate layer 127 may include an n-GaN layer 127a stacked between an n-AlGaN layer 127b and a spacer layer 128 at a thickness of 200 Å to 300 Å, as shown in FIG. 11.

Figure 12:
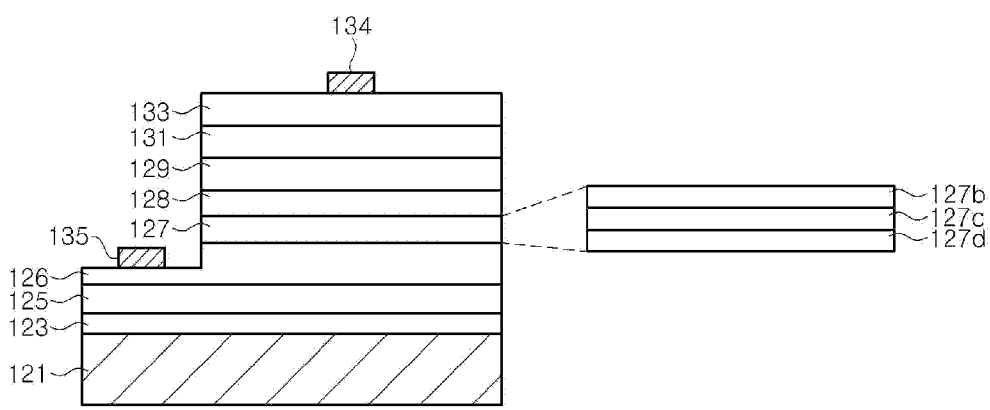
FIG. 12 is a cross-sectional view showing a light emitting diode according to an exemplary embodiment of the present invention.

In addition, the intermediate layer 127 may include an undoped GaN layer 127c and a low-doped n-GaN layer 127d, and be stacked between the n-AlGaN layer 127b and the n-type contact layer 126 at a thickness of 1000 Å to 2000 Å, as shown in FIG. 12. FIG. 12 shows an exemplary embodiment in which the undoped GaN layer 127c is formed on the low-doped n-GaN layer 127d; however, the present invention is not limited thereto but the n-GaN layer 127d may be formed on the undoped GaN layer 127c, as needed. In addition, either the undoped GaN layer 127c or the low-doped n-GaN layer 127d may only be formed.

Figure 13:
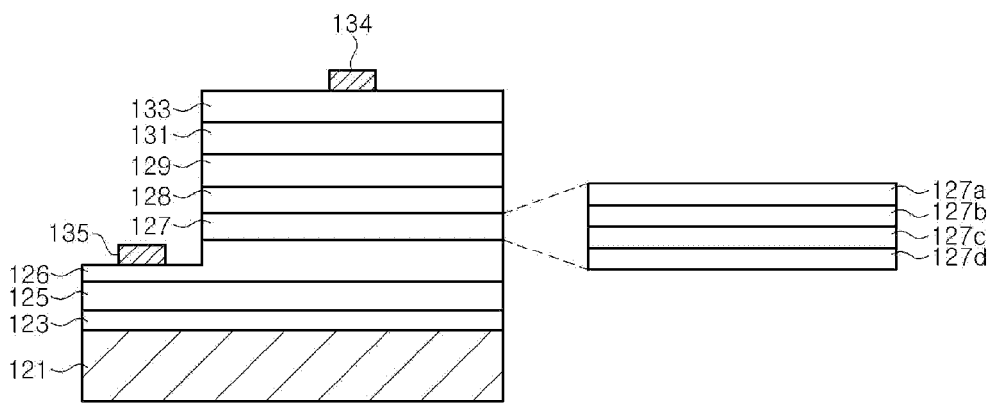
FIG. 13 is a cross-sectional view showing a light emitting diode according to an exemplary embodiment of the present invention.

In addition, the intermediate layer 127 may include the n-GaN layer 127a, the n-AlGaN layer 127b, the undoped GaN layer 127c, and the low-doped n-GaN layer 127d between the spacer layer 128 and the n-type contact layer 126, as shown in FIG. 13. The undoped GaN layer 127c may be made of GaN, which is not intentionally doped with impurities, to have a thickness of 100 Å to 5000 Å. Since the undoped GaN layer 127c is not doped with impurities, it may have relatively higher specific resistance as compared to the n-type contact layer 126. Therefore, electrons introduced into the active layer 129 from the n-type contact layer 126 may be uniformly spread within the n-type contact layer 126 before passing through the undoped GaN layer 127c.

Since the low-doped n-GaN layer 127d is doped with impurities at a lower concentration as compared to the n-type contact layer 126, it may have relatively higher specific resistance as compared to the n-type contact layer 126. Therefore, electrons introduced into the is active layer 129 from the n-type contact layer 126 may be uniformly spread within the n-type contact layer 126 before passing through the low-doped n-GaN layer 127d.

Meanwhile, the p-type clad layer 131, which serves as an electron blocking layer, may be made of AlGaN and be formed in a multi-layer film structure. For example, the p-type clad layer 131 may be made of a multi-layer film of AlGaN/GaN or AlGaN/InGaN. When the p-type clad layer 131 is made of a multi-layer film, it may improve crystallinity of the AlGaN layer. For example, a layer of the p-type clad layer 131, adjacent to the active region 129, may be made of AlGaN, and the Al composition of the AlGaN layer may be gradually lowered toward the p-type contact layer 133. This is to reduce a polarization phenomenon due to the interface between the p-type clad layer 131 and the p-type contact layer 133. In addition, the first AlGaN layer, adjacent to the active region 129, may be thinner than other layers in the p-type clad layer 131. Meanwhile, the AlGaN layer of the p-type clad layer 131 may preferably have a higher energy level than that of the n-AlGaN layer 127b. In other words, in terms of the Al composition, the AlGaN layer of the p-type clad layer 131 is set to be greater than the n-AlGaN layer 127b. As the Al composition of the AlGaN layer of the p-type clad layer 131 is set to be greater than that of the n-AlGaN layer 127b, a conduction band at the n-side may be larger than a conduction band at the p-side based on the active region 129 at the time of applying forward voltage Vf. As a result, the forward voltage Vf should be reduced.

In addition, an InAlN layer may further be included between the active region 129 and the p-type clad layer 131. In this case, in the InAlN layer In composition may be in a range of about 0.10 to 0.20, preferably, in a range of about 0.17 to 0.18. In this case, the growth temperature of the InAlN layer may, for example, be 845° C. and have a superlattice layer of InN/AlN. In addition, the InAlN layer may have a thickness of about 10 nm to 30 nm, and may is be about 18 nm to 22 nm. The InAlN layer may be formed to be thinner than the AlGaN layer of the p-type clad layer 131. For example, the InAlN layer may be formed to be thinner in a ratio of about 3:2 as compared to the AlGaN layer forming the p-type clad layer 131. The InAlN layer may have a dopant concentration of the p-type impurities of about $8 \times 10^{17}$ cm$^{-3}$. At the time of doping the p-type impurities, InN may be doped with the p-type impurities in the superlattice structure of InN/AlN. In this case, the InAlN layer may serve to increase hole concentration. The InAlN layer formed between the active region 129 and the p-type clad layer 131 may reduce effects of the temperature on the active region 129 when growing the p-type clad layer 131 functioning as the electron blocking layer.

In the exemplary embodiments of the present invention, the number of layers doped with n-type impurities in the spacer layer 128, the doping concentration of n-type impurities, the stacked thickness, the stacking times, the intermediate layer 127, the undoped layer 125, and the thickness of the n-type layers may be related to each other and may be controlled, as needed.

As set forth above, the present invention can improve the leakage current characteristics and the electrostatic discharge characteristics of the light emitting diode by doping the final layer with high-concentration silicon without intentionally doping most regions in the superlattice layer disposed near the active region. In addition, exemplary embodiments of the present invention interpose the undoped intermediate layer and the electron reinforcing layer between the superlattice layer and the n-type contact layer, possibly distributing the current and preventing an increase in the forward voltage.

Further, after the electron reinforcing layer is grown, the electron reinforcing layer is maintained at the growth temperature for a predetermined time, thereby making it possible to is improve the crystal quality of the electron reinforcing layer. In addition, the active layer is grown and then, the supply of metal source gas is stopped to relatively extend the time of increasing a substrate temperature at a temperature suitable to grow the p-side gallium nitride-based semiconductor layer, thereby making it possible to lower the leakage current.

Further, the present invention interposes the n-type AlGaN layer between the n-type GaN layers to prevent thread dislocations generated from the low-temperature buffer layer from being transferred to the active region, thereby making it possible to lower the leakage current and improve the electrostatic discharge characteristics.

Further, the present invention improves the crystal quality of the active region, thereby making it possible to increase the recombination rate of the carriers within the active region. In addition, the present invention forms the spacer layer formed of the plurality of layers between the contact layer and the active region, thereby making it possible to reduce strain generated in the active region. Further, the present invention can lower the forward voltage Vf in the active region through the spacer layer by selectively doping only the layer adjacent to the active region with the n-type impurity. In addition, the present invention increases the role of the electron blocking layer, thereby making it possible to increase the recombination rate of the carriers in the active region.

While this invention has been described in connection with what is presently considered to be practical exemplary embodiments, it is to be understood that the invention is not limited to the disclosed exemplary embodiments, but, on the contrary, is intended to cover various modifications and equivalent arrangements included within the spirit and scope of the appended claims.

What is claimed is:

1. A light emitting diode, comprising:
    an n-type contact layer doped with silicon;
    a p-type contact layer;
    an active region disposed between the n-type contact layer and the p-type contact layer, the active region comprising a barrier layer and a well layer;
    a superlattice layer disposed between the n-type contact layer and the active region, the superlattice layer comprising a plurality of layers;
    an undoped intermediate layer disposed between the superlattice layer and the n-type contact layer; and
    an electron reinforcing layer disposed between the undoped intermediate layer and the superlattice layer,
    wherein:
    only a final layer of the superlattice layer closest to the active region is doped with silicon, and the silicon doping concentration of the final layer is higher than that of the n-type contact layer; and
    the superlattice layer comprises a (Al, In, Ga) N-based group III-nitride semiconductor layer having a smaller bandgap than that of the barrier layer and a larger bandgap than that of the well layer.

2. The light emitting diode of claim 1, wherein the final layer of the superlattice layer contacts the active region.

3. The light emitting diode of claim 1, wherein the electron reinforcing layer is doped with silicon, and the silicon doping concentration of the electron reinforcing layer is higher than that of the n-type contact layer.

4. The light emitting diode of claim 3, wherein the electron reinforcing layer contacts the superlattice layer.

5. The light emitting diode of claim 4, wherein the electron reinforcing layer comprises GaN, the superlattice layer comprises an alternately stacked GaN layer and InGaN layer, and the final layer of the superlattice layer comprises GaN.

6. The light emitting diode of claim 5, wherein the n-type contact layer comprises a GaN layer, and the undoped layer comprises GaN.

7. The light emitting diode of claim 1, wherein the silicon doping concentration of the final layer of the superlattice layer is the same as that of the electron reinforcing layer.

8. The light emitting diode of claim 1,
    wherein the n-type contact layer comprises at least two n-type GaN layers and an n-type AlGaN layer disposed between the at least two n-type GaN layers.

9. The light emitting diode of claim 1, further comprising:
a substrate;
a low-temperature buffer layer disposed on the substrate; and
an undoped GaN layer disposed between the low-temperature buffer layer and the n-type contact layer.

* * * * *